United States Patent
Massaro et al.

(10) Patent No.: US 7,083,438 B2
(45) Date of Patent: Aug. 1, 2006

(54) LOCKING COVERS FOR CABLE CONNECTORS AND DATA PORTS FOR USE IN DETERRING SNOOPING OF DATA IN DIGITAL DATA PROCESSING SYSTEMS

(75) Inventors: Timothy John Massaro, Mazeppa, MN (US); Allen John Ziolkowski, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 856 days.

(21) Appl. No.: 10/051,578

(22) Filed: Jan. 18, 2002

(65) Prior Publication Data

US 2003/0156384 A1    Aug. 21, 2003

(51) Int. Cl.
    *H01R 13/44* (2006.01)
(52) U.S. Cl. ..................... 439/133; 439/304
(58) Field of Classification Search ............ 439/133, 439/134, 304, 911; 70/57
    See application file for complete search history.

(56) References Cited

U.S. PATENT DOCUMENTS

| 4,669,281 A | * | 6/1987 | Young ........................... 70/57 |
| 4,932,874 A | * | 6/1990 | Hollopeter et al. ......... 439/133 |
| 5,220,815 A | * | 6/1993 | Davidge et al. ............... 70/14 |
| 6,056,563 A | * | 5/2000 | Betzler ....................... 439/134 |

* cited by examiner

Primary Examiner—Neil Abrams
(74) Attorney, Agent, or Firm—Roy W. Truelson

(57) ABSTRACT

A physical latching mechanism prevents access to or tampering with an I/O port of a computer system. In the preferred embodiment, a display monitor cable of an unattended workstation being operated remotely is disconnected and latched to prevent re-connection and display of remote activity. The latch includes a first latch which locks the cable to the workstation system unit, and a second latch which blocks the open end of the cable. Each latch preferably a pair of L-shaped members which engage each other in a nested fashion, one being attached to a cable coupling while the other is connected to the system unit or is used to block the cable open end. The members are locked by engagement means at one end and a padlock at the other. The latches also serve to obscure fasteners (602, 604, 702) to prevent tampering.

19 Claims, 8 Drawing Sheets

LOCKING COVERS FOR CABLE CONNECTORS AND DATA PORTS FOR USE IN DETERRING SNOOPING OF DATA IN DIGITAL DATA PROCESSING SYSTEMS

FIELD OF THE INVENTION

The present invention relates to digital data processing devices, and in particular to protection of data stored in or processed by digital data processing devices.

BACKGROUND OF THE INVENTION

In the latter half of the twentieth century, there began a phenomenon known as the information revolution. While the information revolution is a historical development broader in scope than any one event or machine, no single device has come to represent the information revolution more than the digital electronic computer. The development of computer systems has surely been a revolution. Each year, the declining prices and expanding capabilities of computers and other digital technology cause them to be used in new and varied applications, and to process and store more user data.

The reduced cost of computing and the general availability of digital devices has brought an explosion in the volume of information stored in such devices. With so much information stored in digital form, it is naturally desirable to obtain wide access from computer systems. As a result, most computer systems are linked to other computer systems via any of various networks. It is not uncommon for a single computer system to have multiple network attachments. For example, the computer may be linked to the Internet, and the same time that it is linked to several computers within a business entity or other organization by a local area network. Additionally, a mainframe type computer may be linked to multiple workstations, any of which may additionally have links to external systems. Information is thus made available to many systems and locations remote from the actual system in which the information is stored and maintained.

Although it is obviously desirable in many cases to make information from one system available remotely to other systems, to do so creates numerous potential security exposures. The potential exposure increases as systems become more remote, i.e., as the number of intermediate connections from one system to another increase. For example, in the case of the Internet, information requested by a client from a server may pass through numerous intermediary systems during transmission. In such an anonymous world, it becomes difficult to verify the identities or authorities of participants, the ultimate destination of information, and whether other parties are snooping. A security exposure at any part of the path potentially exposes the information.

The problem of protecting digital information from corruption by or exposure to unauthorized parties can be likened to an arms race. In this arms race, new technological developments which expand the capabilities of digital data systems also create potential new security exposures. These exposures are often little appreciated or understood by the developers of new technology, but left unattended will eventually be exploited by clever and unscrupulous interlopers. Those who develop countermeasures to protect system integrity are constantly striving to keep up with the potential exposures and the ingenuity of the interlopers. In some cases, countermeasures themselves involve extraordinary technological complexity and consequent development effort. However, in many others, the countermeasure is itself technologically simple, and the difficulty in developing it lies in first appreciating the nature of the security exposure.

Security exposures and their countermeasures can be classified broadly in two categories: data security and physical security. In general, data security involves the use of data as a tool by the interloper to perform some unauthorized act, while physical security involves a physical access, sometimes using a special purpose eavesdropping device. E.g., an interloper who uses conventional hardware such as a remote computer terminal attached to a network or to a larger system to enter data in such a manner as to enable him to perform an unauthorized act has breached data security. An interloper who gains unauthorized physical access to the system, by obtaining access to a secure area or by opening a physical lock on a system component, has breached physical security.

While a great deal of effort has been put into the development of improved data security techniques, these can be rendered useless by simple breaches in physical security. For example, a system may have every sophistication to prevent a data security breach from a remote terminal, and yet if a person can simply walk into the building and room where the main system is located and access information from a system console, from storage media, or otherwise, system security is seriously impaired. All too often, attention is focused on the data security aspect to the neglect of simple physical security.

One form of physical security exposure is created when using any of various remote workstation control software applications. These applications allow a user to take control of a workstation, such as a personal computer, from a remote location. Such applications are useful for debugging workstation or network problems, for downloading and setting up applications on the workstation, and for simply accessing data and performing work using the workstation from a remote location, where the remote location may be an alternate workplace of the user, a mobile computing device, or a temporary work location. When using such an application, the workstation is not necessarily attended, and may be located in an unsecure area. In these circumstances, any unauthorized person could simply watch the user's activity on the workstation display monitor. It is even possible that someone might attach a snooping or recording device to the monitor output port of the workstation. Some remote workstation control applications attempt to blank the display screen of the workstation, but these are not necessarily effective for all workstation configurations; other such applications do not even attempt to blank the screen.

A need exists for improved techniques and devices which prevent exposure of data in an unattended workstation operating under control of a remote workstation control application. Furthermore, a more general need exists for improved techniques and devices for enhancing physical security of data transmitted on I/O ports and cables of unattended systems.

SUMMARY OF THE INVENTION

Various aspects of the present invention involve the use of a physical latching mechanism which prevents access to or tampering with an I/O port of a computer system.

In a first aspect, a display monitor output cable running between a workstation and its display monitor is disconnected and a physical latching mechanism prevents re-connection of the cable and access to the monitor output port of the workstation. In the preferred embodiment, the latching mechanism supports operation of the workstation unattended while under control of a remote workstation control application. Preferably, the monitor cable is detached at an intermediate coupling, a first latch is installed at the coupling between the monitor output port of the system and the monitor cable to prevent detachment of the cable, and a second latch is installed over the open end of the monitor cable to prevent attachment of any device to the open end.

In a second aspect, a latching mechanism prevents physical disengagement of an I/O cable from an I/O port. In the preferred embodiment, the latching mechanism comprises a pair of L-shaped members, one of which is attached to the port coupling while the other is connected to the cable coupling, and which engage each other in a nested fashion and are latched by a padlock passing through respective holes in each member at one end thereof. Preferably, this latching mechanism can be retro-fitted to an existing I/O port and cable using a standard D-shell coupling.

In a third aspect, a latching mechanism prevents physical engagement of an open end of an I/O cable. In the preferred embodiment, the latching mechanism comprises a pair of L-shaped members, one of which is attached to the cable coupling while the other contains a substantially solid face blocking the mating area of the cable, and which engage each other in a nested fashion and are latched by a padlock passing through respective holes in each member at one end thereof.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
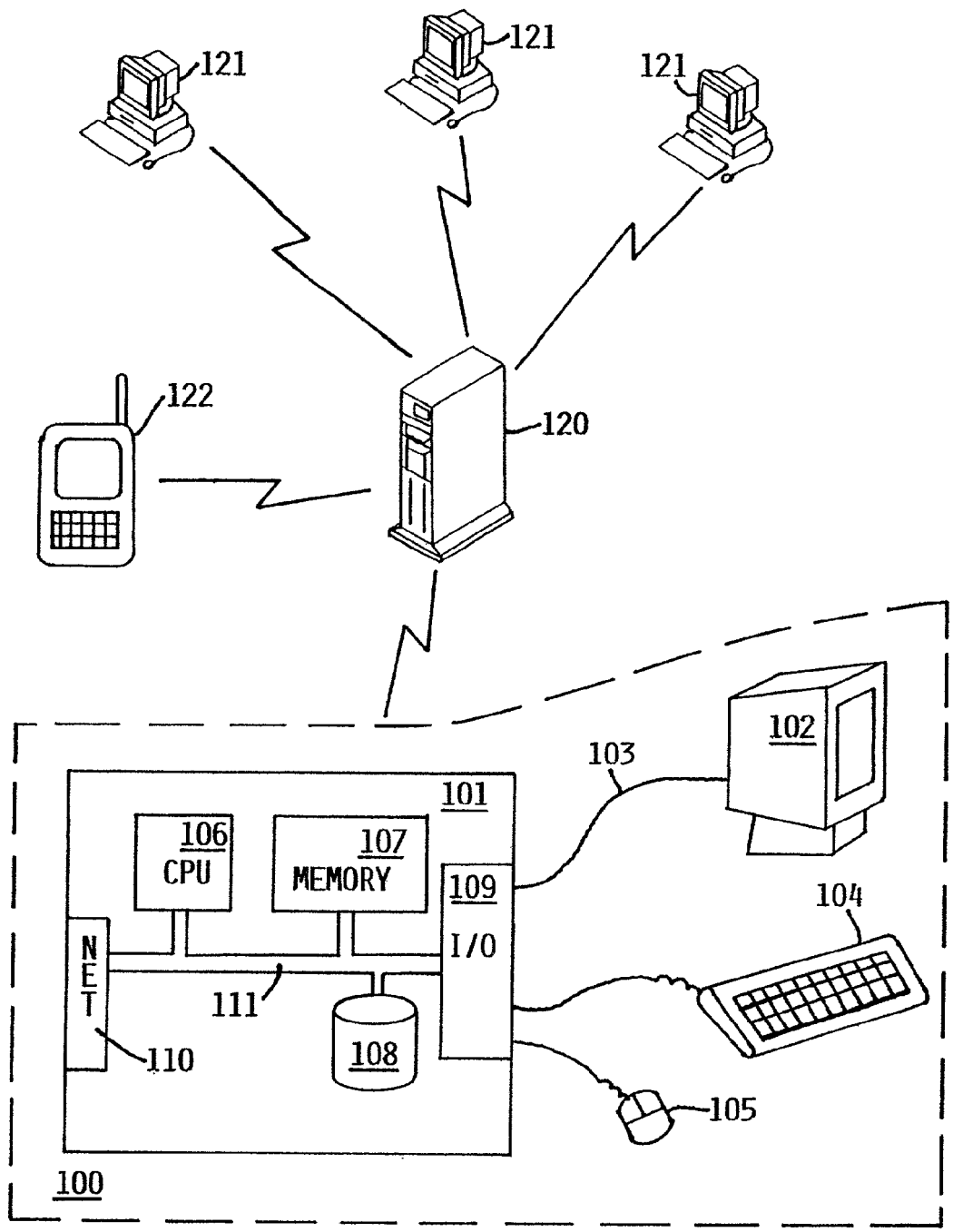
FIG. 1 is a high-level diagram of a workstation in a networked environment, suitable for latching a data cable, according to the preferred embodiment of the present invention.

Referring to the Drawing, wherein like numbers denote like parts throughout the several views, FIG. 1 is a high-level block diagram of a workstation 100 in a networked computing environment, suitable for latching a data cable in accordance with the preferred embodiment of the present invention. Workstation 100 comprises system unit 101, which is a housing containing various electronic components, and a physically separate display monitor 102. The display monitor and system unit are coupled to each other by display monitor data cable 103. Additional I/O devices, such as keyboard 104 and mouse 105, are also attached to system unit 101 via respective cables. System unit 101 contains the key data processing components of workstation 101, including central processing unit (CPU) 106; main memory 107; mass data storage unit 108; I/O ports drivers 109 for driving communications with I/O devices, such as monitor 102, keyboard 104 and mouse 105; network interface 110 for communicating with other computer systems, and communications bus 111. CPU 106 is a general-purpose programmable processor, executing instructions stored in memory 107; while a single CPU is shown in FIG. 1, it should be understood that workstations having multiple CPUs could be used. Memory 107 is a random-access semiconductor memory for storing data and programs; memory is shown conceptually as a single monolithic entity, it being understood that memory is often arranged in a hierarchy of caches and other memory devices. Communications bus 111 supports transfer of data, commands and other information between different components of workstation 100; while shown in simplified form as a single bus, it may be structured as multiple buses, and may be arranged in a hierarchical form. Display 102 is typically a cathode-ray tube display, although other display technologies may be used. Storage 108 is typically one or more rotating magnetic hard disk drives, although other data storage devices could be used.

Network interface 110 provides a connection to a network of computer systems, represented by devices 120–122. Such an interface may be a remote connection through the Internet, or a local area network such as an Ethernet or token ring network, or a mainframe terminal channel interface, such as might be used to connect multiple workstations to a single larger mainframe computer used as a server. Many other types of interface are possible. In physical form, the network connection is typically a wired connection, although it could be any of various forms of wireless connection such as radio frequency, optical link, etc. The network is represented conceptually in FIG. 1 by mainframe system 120, workstations 121, and portable device 122. These devices may be in communication with one another via any available network technology or protocol, and not all devices need use the same technology or protocol. While one a small number of devices is represented in FIG. 1, it will be understood that a network may contain a very large number of devices, and may contain devices of types not represented in FIG. 1.

Workstation 100 will typically be any of various models of single-user computer systems known as "personal computers". The representation of FIG. 1 is intended as an exemplary simplified representation, it being understood that many variations in system configuration are possible in addition to those mentioned here, and that other and additional devices not shown may be attached to or contained within workstation 100. Furthermore, a workstation according to the present invention need not be a personal computer system, and may be a so-called dumb terminal attached to a mainframe, a high-performance terminal, a special-purpose device, or any of various hardware variations.

In accordance with the preferred embodiment, workstation 100 is, at least some of the time, operated in a remote, unattended mode. In this mode, system unit 101 is powered on and processor 106 can execute instructions to process data within workstation 100 in much the same manner as if a user were locally attending the workstation. The user interacts with workstation 100 remotely through another system or terminal. Such a system or terminal could be any of workstations 121 or portable device 122, or some other device not shown in FIG. 1. Remote workstation control application software resident in workstation 100, system 120, and/or workstations/terminals 121,122 allows the remote workstation or terminal at which the user is located to effectively control the operation of workstation 100. I.e., data input by the user at the remote location is transmitted over the network to workstation 100, being treated similarly to data which may be input from any local input device, such as keyboard 104 or mouse 105. Output is similarly transmitted over the network to the remote location.

One of the problems with remote workstation control application software is that, as a result of various hardware and software architectural features, display screen output of workstation 100 is not only sent to the remote user over the network, but often simultaneously transmitted to display 102. It is difficult for the remote workstation control application to guarantee in all configurations and circumstances that screen output will not be displayed on display 102 when operating in remote mode. In accordance with the preferred embodiment of the present invention, this potential security exposure is alleviated by physically latching the display data cable.

Figure 2A:
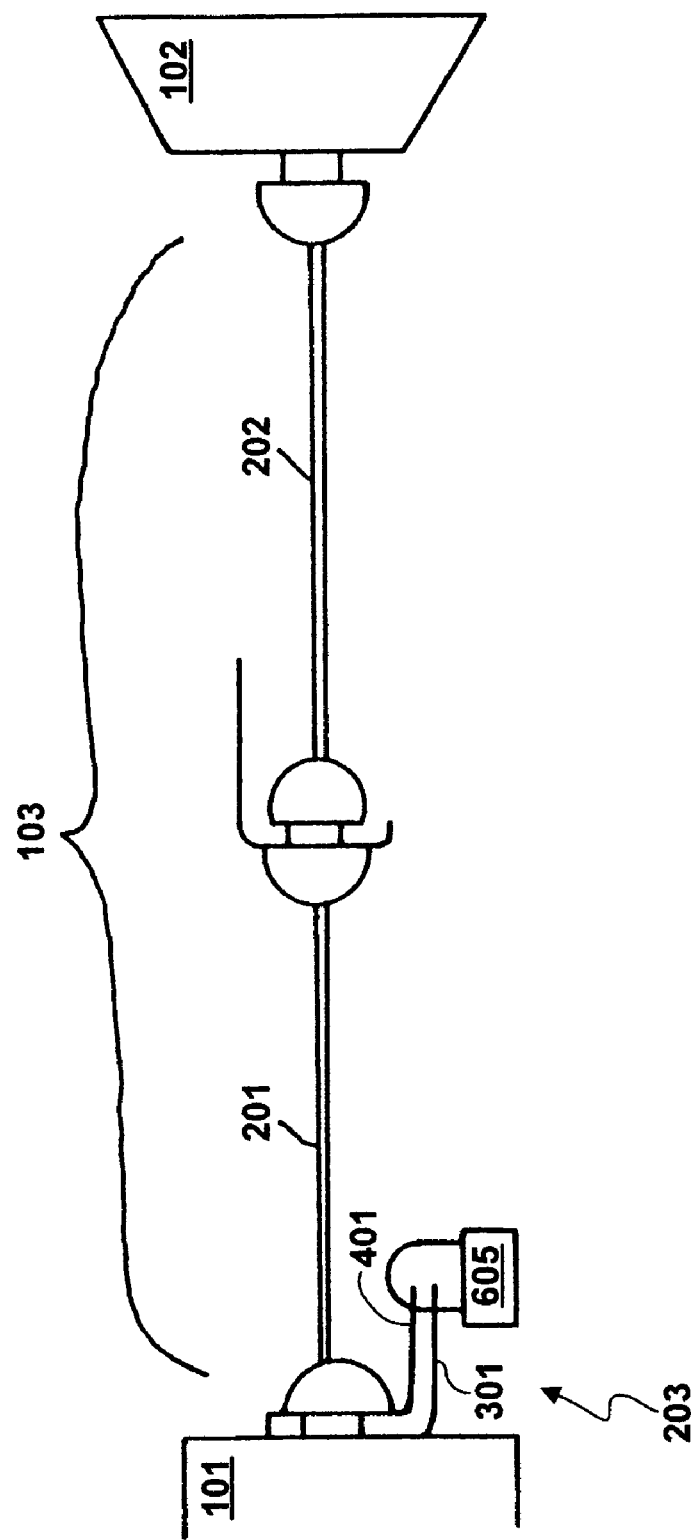
FIGS. 2A and 2B represent the operational configurations of a latching mechanism for a data cable, according to the preferred embodiment.
Figure 2B:
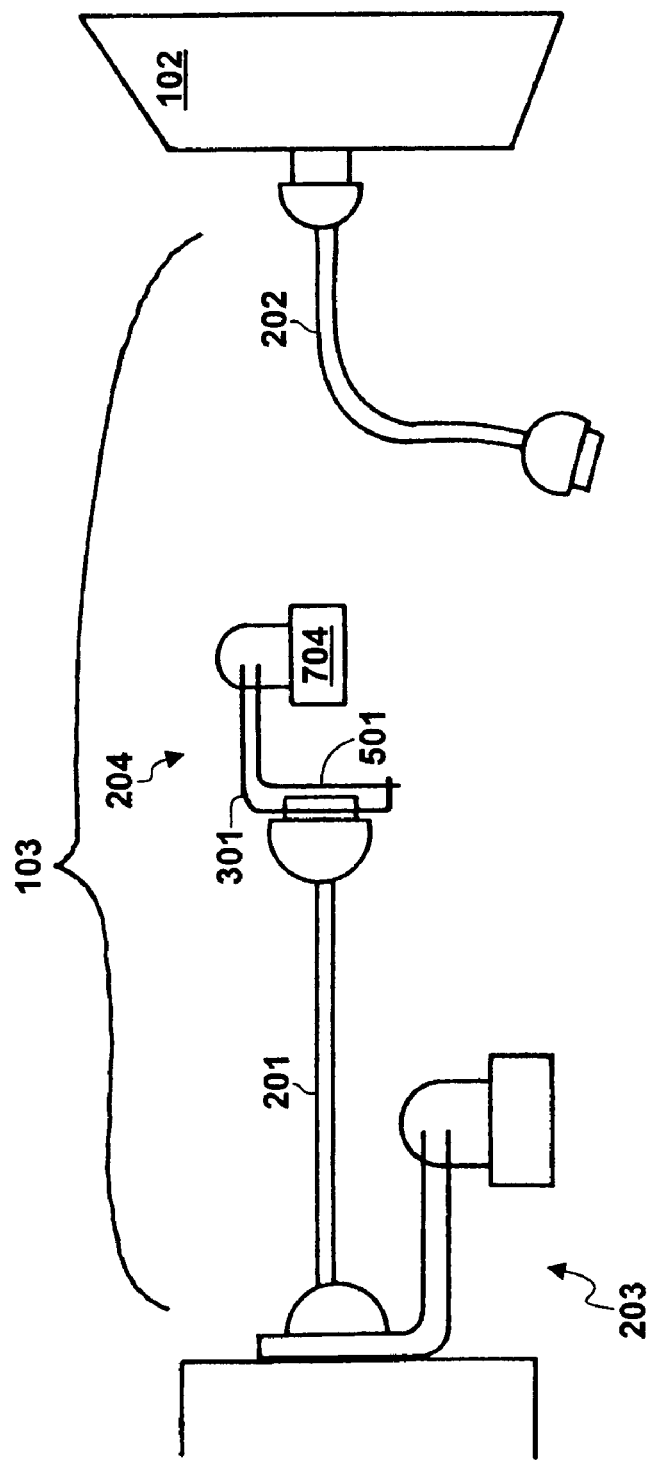

FIGS. 2A and 2B represent the operational configurations of a latching mechanism for data cable 103, according to the preferred embodiment. Preferably, data cable 103 comprises two separable segments 201,202, which are joined by a coupling. Segment 201 is connected to system unit 101, and segment 202 is connected to monitor 102. In both configurations, a latch 203 latches segment 201 to system unit 101, and prevents disconnection of segment 201 from system unit 101.

FIG. 2A represents the configuration of data cable 103 and latching mechanism when workstation 100 is being operated by a user at the physical location of the workstation. In this case, it is desirable to provide a data connection between system unit 101 and monitor 102 so that the user can see the monitor display. Segment 201 and 202 are coupled to each other to form an electrically continuous connection.

FIG. 2B represents the configuration of data cable 103 and latching mechanism for operating workstation 100 in an unattended mode from a remote location using a remote workstation control application. In this configuration, segment 201 is disconnected from segment 202. A latch 204 attaches to the free end of segment 201 after disconnecting segment 202. Latch 204 effectively covers the free end of segment 201 and prevents connection of segment 202, or any other device, to the free end of segment 201.

While it would alternatively be possible to use a single-piece continuous data cable 103 instead of segments 201, 202, and, in the unattended mode configuration, to detach the cable from monitor 102 and attach latch 204 to the free end of the cable, or to detach the cable from system unit 101 and attach latch 204 to the system unit port, the use of a segmented cable is preferred for two reasons. Many monitors and system units are installed with the cable connections in an inconvenient area because the connections are rarely uncoupled; using a segmented cable allows the user to locate the segment-to-segment coupling in a convenient location. Secondly, some monitors have a permanently attached cable, or the portion of latch 204 which is intended to be permanently affixed to the cable coupling might interfere with some monitor couplings.

In the preferred embodiment, each latch 203 and 204 comprises a pair of L-shaped members which, when assembled in a locked configuration, are nested within each other. The L-shaped members are formed of steel, although other materials might be used. The members are relatively flat, elongated bars which are bent to proper shape, and in which holes, notches, radii, and so forth are cut. In the preferred embodiment, three different types of L-shaped member are used.

Figure 3:
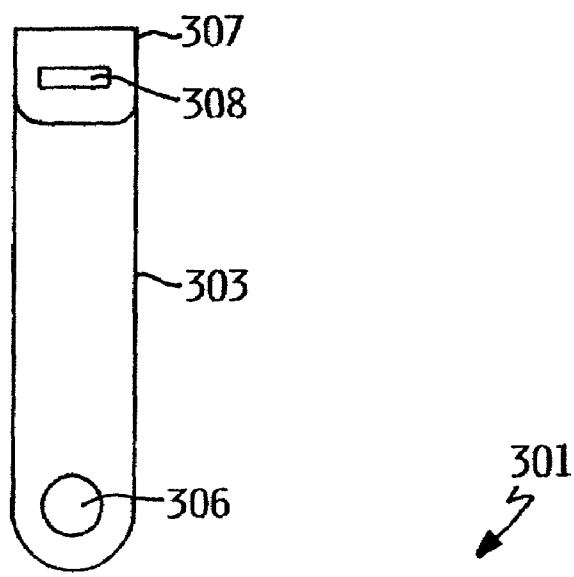
FIG. 3 is an orthogonal 3-view drawing of a first L-shaped piece of a latching mechanism for a data cable, according to the preferred embodiment.
Figure 3:
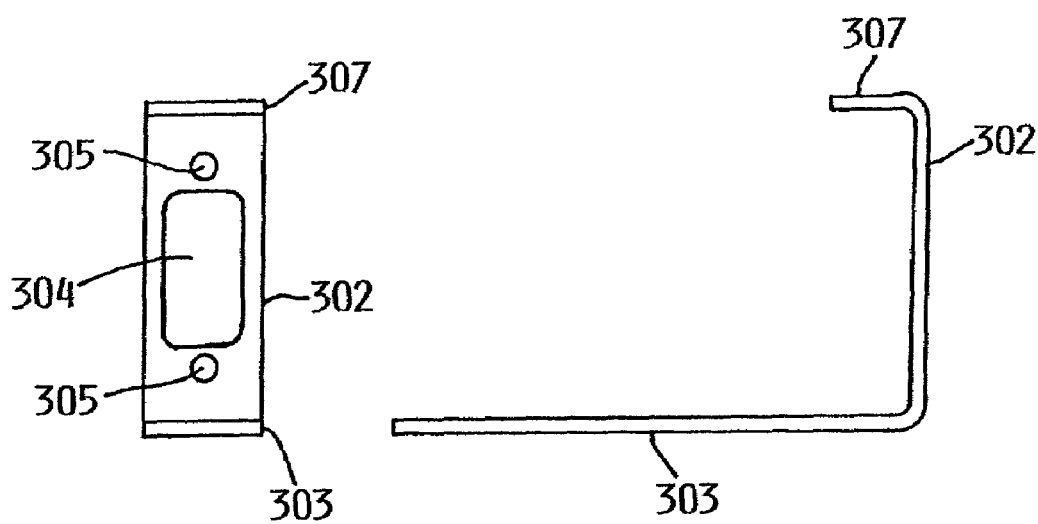

FIG. 3 is an orthogonal 3-view drawing of a first type of L-shaped member 301 of a latching mechanism for a data cable, according to the preferred embodiment. Member 301 is used in both latch 203 which latches the cable to the data port, and in latch 204 which latches the open end of the cable. One major leg 302 of member 301 contains a rectangular hole 304 for the various electrical pins of the cable coupling. On either side of the rectangular hole are a pair of holes 305 for screws. The other major leg 303 contains a single round hole 306 at the far end thereof. Hole 306 is designed to receive the locking bar of a conventional padlock. At the end of major leg 302 is a short orthogonal leg 307, also containing a small rectangular hole 308. Hole 308 is designed to engage with a projection of another L-shaped member of the latching mechanism.

Figure 4:
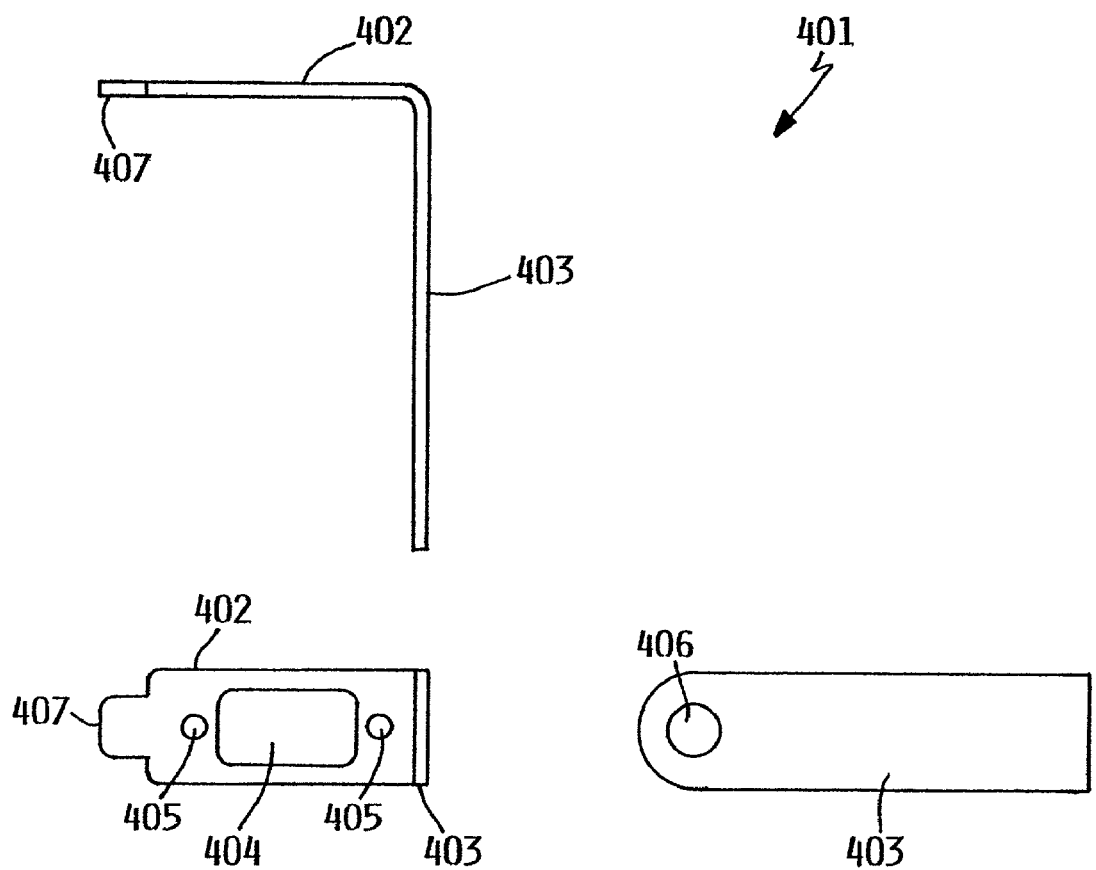
FIG. 4 is an orthogonal 3-view drawing of a second L-shaped piece of a latching mechanism for a data cable, according to the preferred embodiment.

FIG. 4 is an orthogonal 3-view drawing of a second type of L-shaped member 401 of a latching mechanism for a data cable, according to the preferred embodiment. In the preferred embodiment, member 401 is used only in latch 203 which latches the cable to the data port. Like member 301, member 401 contains a major leg 402 having a rectangular hole 404 for the various electrical pins of the cable coupling, and a pair of screw holes 405 on either side of rectangular hole 404. The other major leg 403 contains a single round hole 406 at the far end thereof, for receiving the locking bar of a conventional padlock. At the end of major leg 402 is a projection 407, which is designed to project into rectangular hole 308 of member 301, thus engaging member 301, when in a locked configuration.

Figure 5:
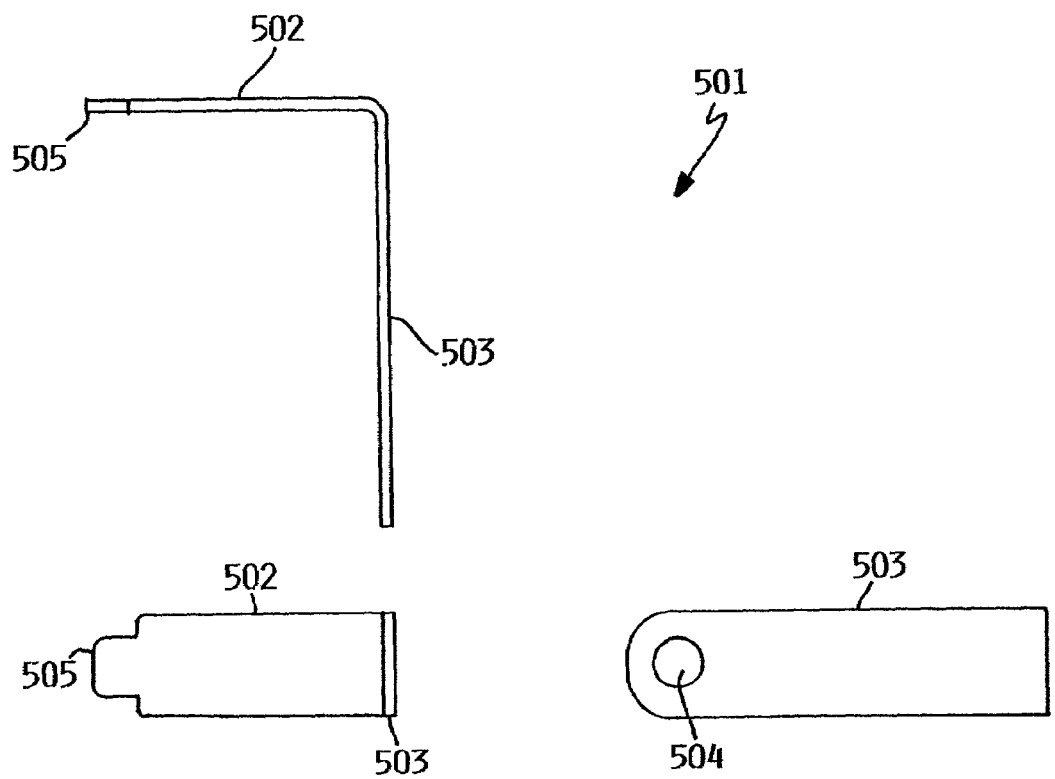
FIG. 5 is an orthogonal 3-view drawing of a third L-shaped piece of a latching mechanism for a data cable, according to the preferred embodiment.

FIG. 5 is an orthogonal 3-view drawing of a third type of L-shaped member 501 of a latching mechanism for a data cable, according to the preferred embodiment. In the preferred embodiment, member 501 is used only in latch 204 which latches the open end of cable segment 201. Member 501 contains major legs 502 and 503. Leg 503 contains a single round hold 504 at the far end thereof, for receiving the locking bar of a conventional padlock. At the end of major leg 502 is a projection 505, which is designed to project into rectangular hole 308 of member 301, thus engaging member 301, when in a locked configuration. It will be observed that member 501 is similar to member 401, except that it lacks holes 404 and 405 in major leg 502, and thus serves to block access to electrical connector pins.

In accordance with the preferred embodiment, latching mechanisms 203 and 204 are retrofitted to standard port and cable hardware using standard screws and a conventional padlock, without any machining, cutting, drilling, shaping, molding or other permanent modification required to the hardware. The latching mechanisms may be subsequently removed and the hardware restored to its original state.

Figure 6:
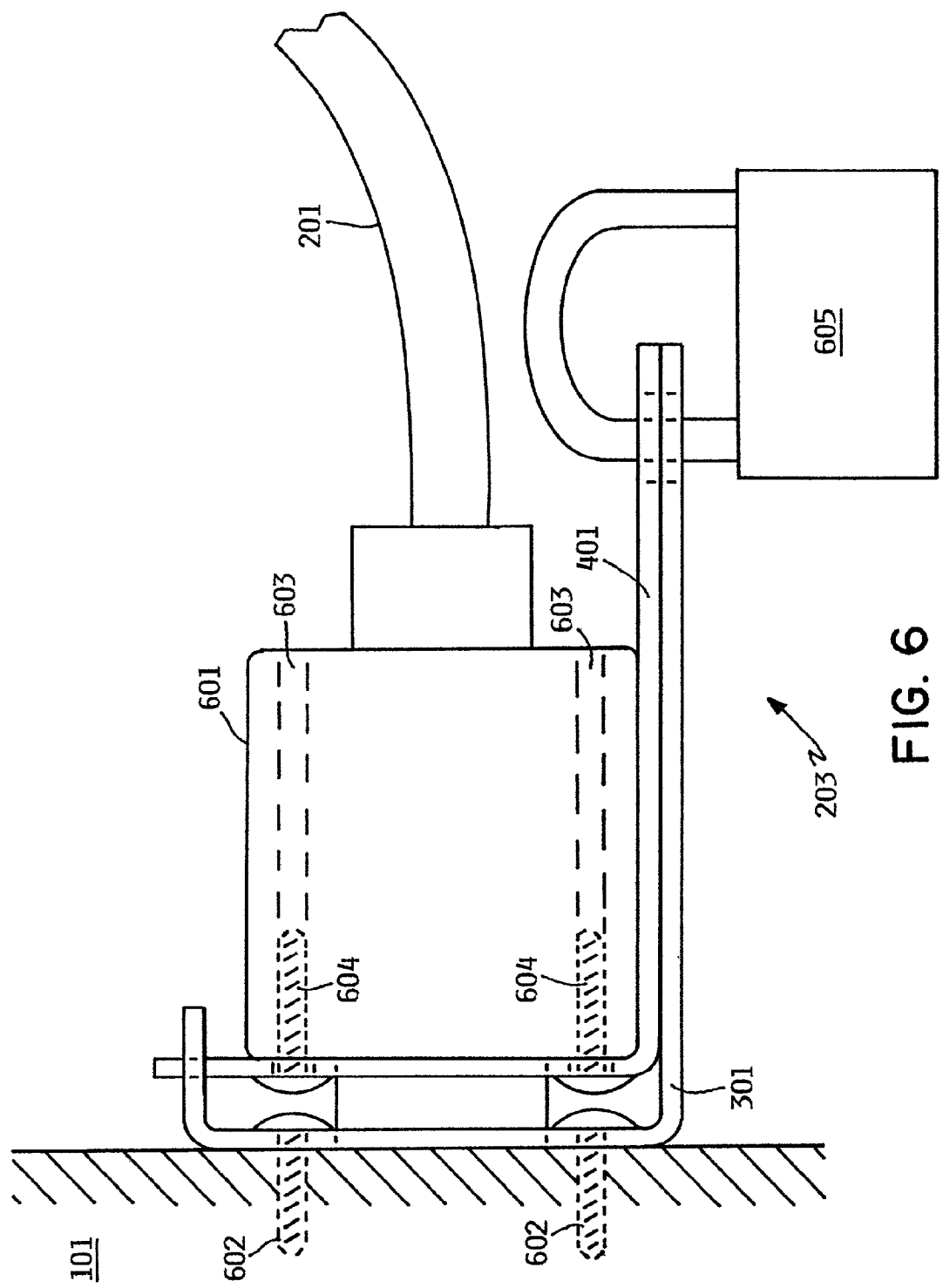
FIG. 6 illustrates a latching mechanism using two L-shaped pieces which latches a data cable to a data port, according to the preferred embodiment.

FIG. 6 illustrates latching mechanism 203 in a locked configuration, according to the preferred embodiment. In this embodiment, latching mechanism 203 latches a coupling 601 of data cable segment 201 to the monitor output port of system unit 101. In order to attach latching mechanism 203, a pair of threaded studs (not shown) on either side of the monitor output port on system unit 101 are removed by unscrewing. Latch member 301 is then attached to system unit 101 by running two shallow head screws 602 through holes 305 in member 301 and screwing screws 602 into the threaded holes from which the studs were removed. Similarly, a pair of long screws (not shown) are removed from through holes 603 in coupling 601. Latch member 401 is then attached to coupling by running two shallow screws 604 through holes 405 in member 401, and screwing screws 604 into through holes 603. Although holes 603 are not threaded, the coupling is typically made of a somewhat elastic molded plastic material, into which screws 604 of a suitable size will thread themselves. It is preferred that screws 602 and 604 have round heads with Allen, spline or star type engagement holes in the center, which make it almost impossible in the small available clearance area to remove the screws when in a locked configuration. Slotted screws having flat, countersunk heads provide greater clearance for cable hardware (if needed) and are also virtually impossible to remove with the latch engaged.

L-shaped members 301 and 401 are attached to system unit 101 and coupling 601 respectively with screws 602 and 604 before engaging the lock mechanism, and are intended to be left in place even if the cable is disconnected from the system unit temporarily (e.g., to move the units or for other maintenance). To lock the cable to the system unit, projection 407 of member 401 is inserted into hole 308 of member 301, and the coupling is plugged into the mating system unit port connector with a slight turning motion. Padlock 605 is then inserted through holes 306, 406 in the L-shaped members and locked, preventing disengagement.

Figure 7:
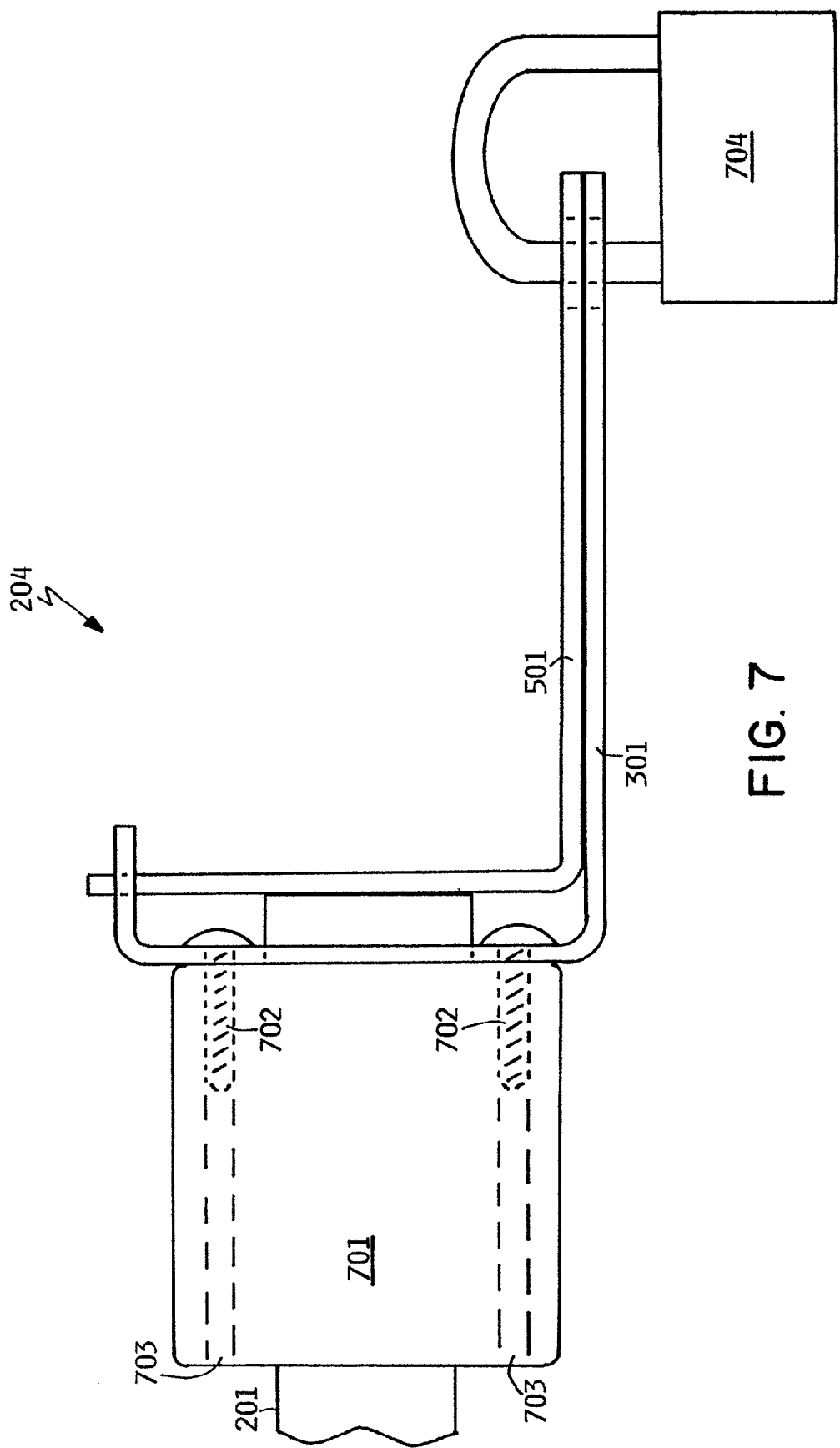
FIG. 7 illustrates a latching mechanism using two L-shaped pieces which locks the open end of a data cable, according to the preferred embodiment.

FIG. 7 illustrates latching mechanism 204 in a locked configuration, according to the preferred embodiment. In this embodiment, latching mechanism 204 latches an open and unattached coupling 701 of data cable segment 201 to prevent attachment of a device or cable to the open end. In order to attach latching mechanism 204, a pair of long screws (not shown) are removed from through holes 703 in coupling 701. Latch member 301 is then attached to coupling 701 by running two shallow screws 702 through holes 305 in member 301, and screwing screws 702 into through holes 703. Screws 702 preferably have round heads with Allen, spline or star type engagement holes in the center to make removal while locked nearly impossible.

L-shaped member 301 is attached to coupling 701 with screws 702 before engaging the lock mechanism, and is intended to be left in place when the cable segments 201 and 202 are connected as shown in FIG. 2A. To engage latch 204, projection 505 of member 501 is inserted into hole 308 of member 301, and holes 306 and 504 are aligned. Padlock 704 is then inserted through holes 306, 504 and locked, preventing disengagement.

Since latch 204 which covers the open cable end has greater clearance area in the vicinity of the coupling than latch 203, several alternative variations are possible. For example, the open end could be covered by attaching L-shaped member 401 to coupling 701 in exactly the same manner as the attachment of member 401 to coupling 601 in FIG. 6, and by engaging and latching a second L-shaped member to member 401 in the same manner as shown in FIG. 6. This second L-shaped member would be identical to member 301, except that it would not have holes 304 and 305, and would instead have a solid leg 302. Furthermore, it will be observed that, in the case of latch 203, the use of an L-shaped member locates the padlock a sufficient distance from the system unit to allow clearance, but that such an extension is not necessary in the case latch 204. The L-shaped members are used in the preferred embodiment chiefly to reduce the number of different parts. The open end of the cable could alternatively be secured by relatively straight members which have an engagement mechanism at one end, and a padlock hole at the other.

A latch mechanism as described herein may further be used to lock two cable couplings together. I.e., referring to FIG. 6, instead of system unit 101, member 301 might be attached with screws 602 to another cable coupling which mates with cable coupling 601. As noted above, L-shaped members are used in the preferred embodiment to provide clearance near the port of a system unit or other large device. Where such clearance is not necessary, as in the case of two cable couplings, it may be possible to use a pair of straight members having an engagement mechanism at one end and holes for a padlock at the other.

In the preferred embodiment, two latches are used to disconnect and lock the display monitor cable of an unattended workstation. However, either or both of the latches described herein may be used in different applications and environments. Latches as described herein may be used for preventing the disconnection of cable couplings (and possible malicious insertion of snooping devices) as well as for preventing the attachment of cable couplings to open ends of cables.

Various alternative designs of the latch mechanism are possible. In the preferred embodiment, the L-shaped members engage each other at one end using a projection-in-hole. However, any of various alternative engagement mechanisms could be used. Example of alternative mechanisms include: a knob which is inserted into a slot; a set of bent fingers which engage one another; etc.

In the description herein, various references have been made to latches and latching mechanisms which prevent unauthorized attachment or detachment of data cables. As used herein and applied to the latching mechanism, "prevent" means that an unauthorized attachment or detachment of cables can not take place without some additional extraordinary action which defeats the latch. For example, the latch could be physically broken; the padlock could be picked; the key to the padlock could be stolen; etc. It is understood that in the realm of security, all prevention is relative, and there is no single device that can assure absolutely and for all time that unauthorized access will not take place. The purpose of any security device is to enhance security by providing an additional barrier to unauthorized access which the interloper must circumvent, and which therefore increases the difficulty for the interloper and/or the risk of detection and apprehension.

In the preferred embodiment described herein, a simple but effective latching mechanism using L-shaped members and padlocks is attached to couplings of conventional data cables to prevent transmission of data to a monitor while a workstation is operated in unattended mode. The latching mechanism of the preferred embodiment has the advantages of ease of manufacture and installation, and does not require modification to conventional cable and port hardware. However, any number of alternative latching mechanisms could be used for locking out data to the monitor when a workstation is operated in unattended mode. For example, a data cable could contain an integral lock and switch mechanism, in which a switch which disconnects one or more signal lines is operated with a keyed lock cylinder. Such a data cable would still be locked to the system unit at the system unit's display output port (preferably using latch 203 described herein), but would not require physical disconnection in the middle. This alternative might be easier to operate than that disclosed as the preferred embodiment, but would also be more expensive. As an additional alternative example, the system unit might contain an integral lock and switch mechanism operated by a keyed lock cylinder, for the display monitor output port.

In the preferred embodiment, the latch described herein is used as a data security mechanism. However, such a latch could additionally or alternatively serve the function of an anti-theft device, in which the data cable itself might be used to physically tie down some component which could otherwise be stolen. If some portion of the cable is attached to a building fixture or a heavy object, such as a desk, and a data cable coupling is attached to a component, such as a system unit or monitor, using one of the latch devices described herein, theft of the component becomes more difficult. Since, in the preferred embodiment, the open end of the cable contains a latch with a padlock, this padlock might be conveniently inserted through any appropriately sized and available structure attached to a heavy or immovable object. Alternatively, the cable might pass through an opening in a desk or other furniture, and be attached to components (e.g., monitor and system unit) at either end, the opening being too small for either component, so that it is impossible to remove either component or the component and cable assembly.

Although a specific embodiment of the invention has been disclosed along with certain alternatives, it will be recognized by those skilled in the art that additional variations in form and detail may be made within the scope of the following claims:

What is claimed is:

1. A latching apparatus which latches a data cable coupling in an electronically coupled configuration to a data port of an electronic device, comprising:
   a first member which is securely attached to said electronic device using at least one first removable fastener, wherein said first member comprises an L-shaped member;
   a second member which is securely attached to said data cable coupling using at least one second removable fastener, wherein said second member comprises an L-shaped member; and
   a locking mechanism which locks said first and second members together in said electronically coupled configuration;
   wherein, when said first and second members are locked together in said electronically coupled configuration, said first and second removable fasteners are obscured so as to be non-removable; and
   wherein, when said first and second members are locked together in said electronically coupled configuration, said first and second members are positioned in a nested configuration.

2. The latching apparatus of claim 1, wherein:
   said first member contains an aperture at a first end thereof;
   said second member contains an aperture at a first end thereof; and
   said locking mechanism comprises a padlock which passes through said aperture in said first member and said aperture in said second member.

3. The latching apparatus of claim 1, wherein:
   said first member contains an aperture at a first end thereof;
   said second member contains an aperture at a first end thereof and an engagement mechanism at a second end thereof for engaging a second end of said first member when said first and second members are locked together in said electronically coupled configuration; and
   said locking mechanism comprises a padlock which passes through said aperture in said first member and said aperture in said second member.

4. The latching apparatus of claim 1, wherein said first and second members are removable from said electronic device and data cable by removing said removable fasteners, and wherein said electronic device and data cable may be restored to their original state upon removal of said first and second members.

5. A latching apparatus for a data cable, comprising:
   a first member which is securely attached to a coupling at an open end of said data cable using at least one first removable fastener, wherein said first member comprises an L-shaped member;
   a second member which, in a locked configuration, obscures at least a portion of said coupling to prevent electrical attachment of a device to said coupling, wherein said second member comprises an L-shaped member; and
   a locking mechanism which locks said first and second members together in said locked configuration;
   wherein, when said first and second members are locked together in said locked configuration, said first removable fastener is obscured so as to be non-removable; and
   wherein, when said first and second members are locked together in said locked configuration, said first and second members are positioned in a nested configuration.

6. The latching apparatus of claim 5, wherein:
   said first member contains an aperture at a first end thereof;
   said second member contains an aperture at a first end thereof and an engagement mechanism at a second end thereof for engaging a second end of said first member when said first and second members are locked together in said electronically coupled configuration; and
   said locking mechanism comprises a padlock which passes through said aperture in said first member and said aperture in said second member.

7. The latching apparatus of claim 5, wherein said first member is removable from said data cable by removing said at least one removable fastener, and wherein said data cable may be restored to its original state upon removal of said first member.

8. A computer system, comprising:
   an electronic component having a data port;
   a data cable having a first coupling for forming an electrical connection with said data port;
   a first member which is securely attached to said electronic component using at least one first removable threaded fastener, said at least one first removable threaded fastener traversing at least one respective first through hole in said first member and screwing into said electronic device in a first direction;
   a second member which is securely attached to said data cable coupling using at least one second removable threaded fastener, said at least one second removable threaded fastener traversing at least one respective second through hole in said second member and screwing into said data cable coupling in a second direction; and
   a locking mechanism which locks said first and second members together in said electronically coupled configuration;
   wherein, when said first and second members are locked together in said electronically coupled configuration, said first direction is substantially opposite said second direction, and said first and second removable fasteners are obscured so as to be non-removable.

9. The computer system of claim 8, wherein said electronic component is a system unit, and said data cable communicates with at least one other component of said system.

10. The computer system of claim 8, wherein said data cable is securely attached to another object, thereby deterring theft of said electronic component.

11. The computer system of claim 8, wherein said first and second members are removable from said electronic device and data cable by removing said removable fasteners, and wherein said electronic component and data cable may be restored to their original state upon removal of said first and second members.

12. The computer system of claim 8, further comprising:
a third member which is securely attached to a second coupling of said data cable at an end of said cable opposite said first coupling using at least one third removable fastener;
a fourth member which, in a locked configuration, obscures at least a portion of said second coupling to prevent electrical attachment of a device to said second coupling; and
a locking mechanism which locks said third and fourth members together in said locked configuration;
wherein, when said third and fourth members are locked together in said locked configuration, said third removable fastener is obscured so as to be non-removable.

13. The computer system of claim 8, wherein:
said first and second members are flat, elongated members; and
when said first and second members are locked together in said electronically coupled configuration, said first and second members are positioned adjacent each other their elongated length.

14. A computer system comprising:
an electronic component having a data port;
a data cable having a first coupling for forming an electrical connection with said data port;
a first member which is securely attached to said electronic component using at least one first removable fastener, wherein said first member comprises an L-shaped member;
a second member which is securely attached to said data cable coupling using at least one second removable fastener, wherein said second member comprises an L-shaped member; and
a locking mechanism which locks said first and second members together in said electronically coupled configuration;
wherein, when said first and second members are locked together in said electronically coupled configuration, said first and second removable fasteners are obscured so as to be non-removable; and
wherein, when said first and second members are locked together in said electronically coupled configuration, said first and second members are positioned in a nested configuration.

15. The computer system of claim 14, wherein:
said first member contains an aperture at a first end thereof;
said second member contains an aperture at a first end thereof; and
said locking mechanism comprises a padlock which passes through said aperture in said first member and said aperture in said second member.

16. The computer system of claim 14, wherein said electronic component is a system unit, and said data cable communicates with at least one other component of said system.

17. The computer system of claim 14, wherein said data cable is securely attached to another object, thereby deterring theft of said electronic component.

18. The computer system of claim 14, wherein said first and second members are removable from said electronic device and data cable by removing said removable fasteners, and wherein said electronic component and data cable may be restored to their original state upon removal of said first and second members.

19. The computer system of claim 14, further comprising:
a third member which is securely attached to a second coupling of said data cable at an end of said cable opposite said first coupling using at least one third removable fastener;
a fourth member which, in a locked configuration, obscures at least a portion of said second coupling to prevent electrical attachment of a device to said second coupling; and
a locking mechanism which locks said third and fourth members together in said locked configuration;
wherein, when said third and fourth members are locked together in said locked configuration, said third removable fastener is obscured so as to be non-removable.

* * * * *